(12) United States Patent
Nishimura

(10) Patent No.: US 7,787,225 B2
(45) Date of Patent: Aug. 31, 2010

(54) SEMICONDUCTOR APPARATUS USING BACK-SIDE HIGH-WITHSTAND-VOLTAGE INTEGRATED CIRCUIT

(75) Inventor: Kazuhiro Nishimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 871 days.

(21) Appl. No.: 11/673,756

(22) Filed: Feb. 12, 2007

(65) Prior Publication Data

US 2008/0099838 A1    May 1, 2008

(30) Foreign Application Priority Data

Oct. 30, 2006    (JP) .............................. 2006-294207

(51) Int. Cl.
    *H02H 9/00*    (2006.01)
(52) U.S. Cl. ........................................................ 361/56
(58) Field of Classification Search .................... 361/56
    See application file for complete search history.

(56) References Cited

U.S. PATENT DOCUMENTS 6,353,236 B1 *    3/2002    Yatsuo et al. .................. 257/77
6,603,328 B2 *    8/2003    Takahashi et al. ........... 324/765

FOREIGN PATENT DOCUMENTS

JP    2000-183341    6/2000

* cited by examiner

*Primary Examiner*—Stephen W Jackson
(74) *Attorney, Agent, or Firm*—Oblon, Spivak, McClelland, Maier & Neustadt, L.L.P.

(57) ABSTRACT

A semiconductor apparatus includes an electroconductive member; a switching device electrically connected to the electroconductive member on the electroconductive member and having a withstand voltage between a front side and a back side as a first withstand voltage; a back-side high-withstand-voltage integrated circuit provided on the electroconductive member separately from the switching device, incorporating a control circuit for controlling turning-on/off of the switching device, and having a withstand voltage between a front side and a back side as a second withstand voltage higher than the first withstand voltage; an insulating substrate provided on the electroconductive member separately from the switching device and the back-side high-withstand-voltage integrated circuit; input/output wiring connected to the insulating substrate; first wiring connecting the insulating substrate and the switching device; and second wiring connecting the insulating substrate and back-side high-withstand-voltage integrated circuit.

4 Claims, 4 Drawing Sheets

SEMICONDUCTOR APPARATUS USING BACK-SIDE HIGH-WITHSTAND-VOLTAGE INTEGRATED CIRCUIT

BACKGROUND OF THE INVENTION

1. Field of the Invention

The present invention relates to a semiconductor apparatus using a back-side high-withstand-voltage integrated circuit and, more particularly, to a semiconductor apparatus provided in a motor vehicle engine ignition system or the like.

2. Background Art

Power semiconductor devices typified by insulated gate bipolar transistors (IGBTs) are widely used for control in motor vehicle engine ignition systems and for control of motors for example (see, Japanese Patent Laid-Open No. 2000-183341).

FIG. 7 shows the construction of a semiconductor apparatus used in a motor vehicle engine ignition system. A semiconductor apparatus 1 is constructed by using an electroconductive member 2 on which a power semiconductor device 3 and an insulating substrate 5 are provided separately from each other. An integrated circuit semiconductor device 41 and passive element units 6 including capacitors and resistors are provided on the insulating substrate 5. The power semiconductor device 3 and the insulating substrate 5 are connected to each other through wiring 8. Input/output wiring 7a is connected to the insulating substrate 5, while input/output wiring 7b is connected to the electroconductive member 2. A switching device such as an IGBT is used as the power semiconductor device 3. The power semiconductor device 3 is connected to the integrated circuit semiconductor device 41 via wiring 8. The integrated circuit semiconductor device 41 has a control circuit for controlling turning-on/off of the power semiconductor device 3.

In the above-described conventional semiconductor apparatus, a high potential is generated on the electroconductive member 2 when the power semiconductor device 3 is driven. Therefore, the integrated circuit semiconductor device 41 is formed on the insulating substrate 5 and arranged to operate at a low voltage. This arrangement entrails a problem that it is difficult to reduce the size of the control circuit of the integrated circuit semiconductor device 41 and, hence, the size of the entire package.

SUMMARY OF THE INVENTION

In view of the above-described problem, an object of the present invention is to provide a semiconductor apparatus having a power semiconductor device and an integrated circuit semiconductor device for controlling the power semiconductor device, and arranged to have improved functionality and a reduced size.

According to one aspect of the present invention, a semiconductor apparatus includes an electroconductive member; a switching device electrically connected to the electroconductive member on the electroconductive member and having a withstand voltage between a front side and a back side as a first withstand voltage; a back-side high-withstand-voltage integrated circuit provided on the electroconductive member separately from the switching device, incorporating a control circuit for controlling turning-on/off of the switching device, and having a withstand voltage between a front side and a back side as a second withstand voltage higher than the first withstand voltage; an insulating substrate provided on the electroconductive member separately from the switching device and the back-side high-withstand-voltage integrated circuit; input/output wiring connected to the insulating substrate; first wiring connecting the insulating substrate and the switching device; and second wiring connecting the insulating substrate and back-side high-withstand-voltage integrated circuit.

According to the present invention, the semiconductor apparatus having a power semiconductor device and an integrated circuit semiconductor device for controlling the power semiconductor device can have improved functionality and a reduced size.

Other and further objects, features and advantages of the invention will appear more fully from the following description.

DETAILED DESCRIPTION OF THE PREFERRED EMBODIMENTS

Figure 1:
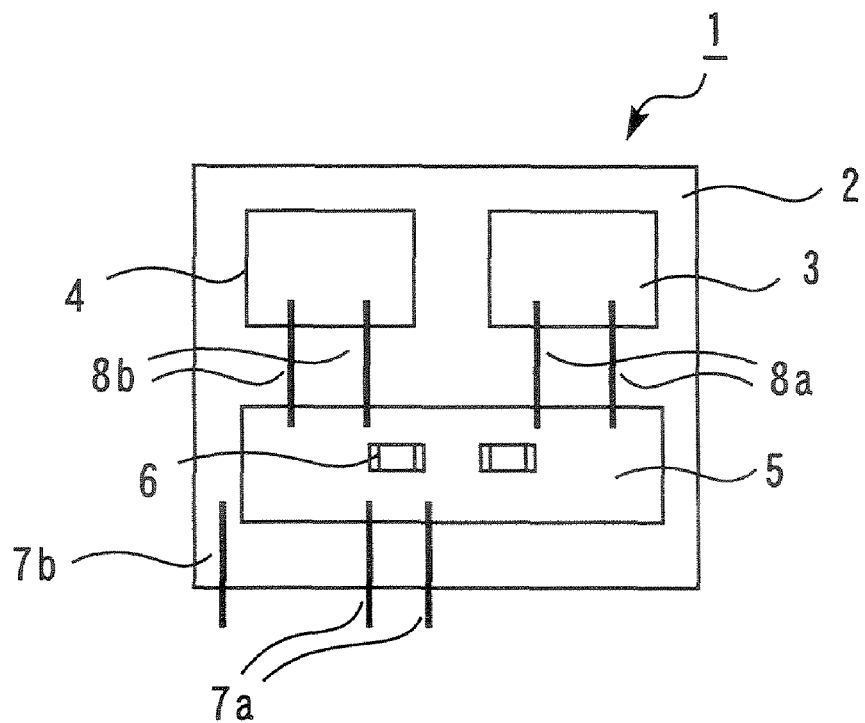
FIG. 1 is a plan view of a semiconductor apparatus according to a first embodiment of the present invention.

Embodiments of the present invention will be described with reference to the drawings. In the drawings, components identical or corresponding to each other are indicated by the same reference characters. The description of the components will be made so as to avoid redundancy of description of the identical or corresponding components.

First Embodiment

A semiconductor apparatus 1 according to a first embodiment of the present invention will be described. As shown in FIG. 1, the semiconductor apparatus 1 is formed by using an electroconductive member 2. A first switching device 3 is provided as a power semiconductor device on the electroconductive member 2, and is electrically connected to the electroconductive member 2. A back-side high-withstand-voltage integrated circuit 4 is provided on the electroconductive member 2 separately from the first switching device 3.

A control circuit (not shown) for controlling turning-on/off of the first switching device 3 is provided on a surface of the back-side high-withstand-voltage integrated circuit 4. The withstand voltage between the region (front side) where the control circuit for the back-side high-withstand-voltage integrated circuit 4 is formed and the back side is higher than the withstand voltage between the front and back sides of the first switching device 3. That is, if the withstand voltage of the first switching device 3 is $V_1$ and the withstand voltage between the front and back sides of the back-side high-withstand-voltage integrated circuit 4 is $V_2$, a relationship $V_1 < V_2$ is established. Thus, the semiconductor apparatus 1 is arranged so that insulation of the back-side high-withstand-voltage integrated circuit 4 is maintained even when a voltage higher than the withstand voltage between the front and back sides of the first switching device 3 is applied to between the front and back sides of the back-side high-withstand-voltage integrated circuit 4.

On the electroconductive member 2, an insulating substrate 5 is provided separately from the first switching device 3 and the back-side high-withstand-voltage integrated circuit 4. Passive element units 6 including capacitors and resistors are provided on the insulating substrate 5. Two input/output wiring lines 7a are connected to the insulating substrate 5, while one input/output wiring line 7b is connected to the electroconductive member 2. The insulating substrate 5 and the first switching device 3 are connected to each other by two first wiring lines 8a, while the insulating substrate 5 and the back-side high-withstand-voltage integrated circuit 4 are connected to each other by two second wiring lines 8b.

In the semiconductor apparatus 1 shown in FIG. 1, the first switching device 3 and the integrated circuit incorporating the control circuit for controlling turning-on/off of the first switching device 3 can be mounted on one electroconductive member by using an electroconductive joining material. The size of the insulating substrate 5 is thus reduced to increase the packaging density of the above-described control circuit. As a result, the size of the semiconductor apparatus 1 can be reduced to realize high-density mounting in a package. Further, mounting of the power semiconductor device and the integrated circuit on one electroconductive member ensures that semiconductor apparatus has improved thermal coupling and high overheat shutoff accuracy.

Figure 2:
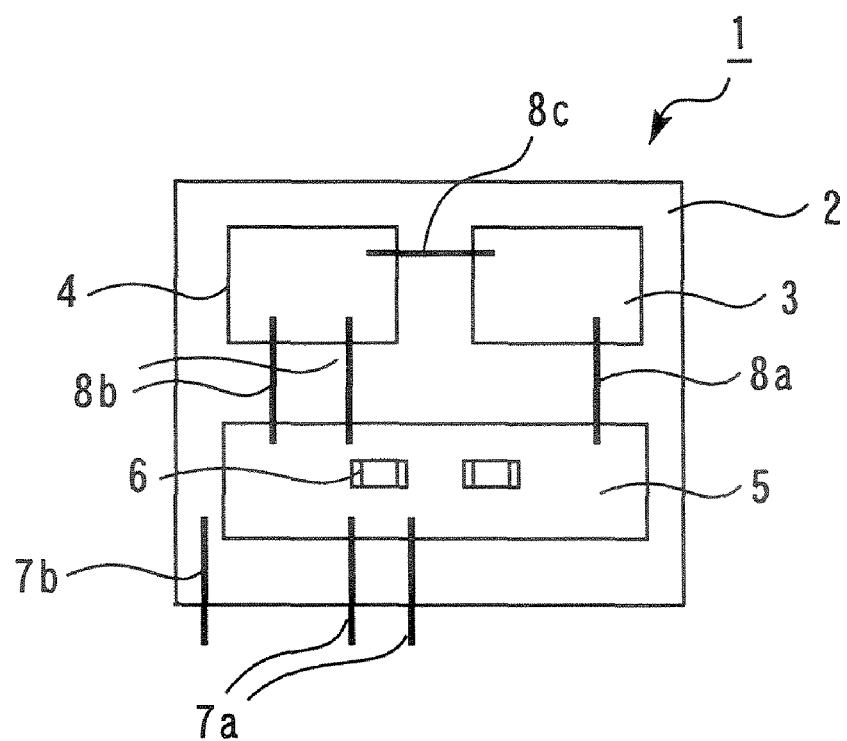
FIG. 2 is a plan view of another semiconductor apparatus according to the first embodiment of the present invention.

Another example of the construction of the semiconductor apparatus 1 shown in FIG. 1 will be described. As shown in FIG. 2, the insulating substrate 5 and the first switching device 3 are connected to each other by one first wiring line 8a. Also, the first switching device 3 and the back-side high-withstand-voltage integrated circuit 4 are connected to each other by one third wiring line 8c. In other respects, the construction is the same as that shown in FIG. 1. The construction shown in FIG. 2 also has the same effects as those of the construction shown in FIG. 1.

As described above, the semiconductor apparatus according to the first embodiment of the present invention can be implemented as a semiconductor apparatus having a power semiconductor device and an integrated circuit semiconductor device for controlling the power semiconductor device and having improved functionality and a reduced size.

Second Embodiment

A semiconductor apparatus according to a second embodiment of the present invention will be described. Description will be made mainly of points of difference from the first embodiment.

An engine ignition semiconductor apparatus in an ignition system for internal combustion engine such as a motor vehicle engine incorporates a power semiconductor device and an inductive load connected to the power semiconductor device, and a computer in the apparatus controls ignition timing. If a control signal for this control is maintained in the on state for a long time, the power semiconductor device is maintained in the conductive state and there is a possibility of the device itself being broken by heat generation therein. The above-described semiconductor apparatus therefore has, in order to prevent the breakage, a function to forcibly turn off the power semiconductor device by using a timer circuit which operates a certain time period after the beginning of the on-operation. At the time of forced turning-off, however, large electromotive force is generated in the inductive load. Therefore, there is also a possibility of the device being broken by ignition error, i.e., the occurrence of ignition at a time not intended by the computer.

Figure 3:
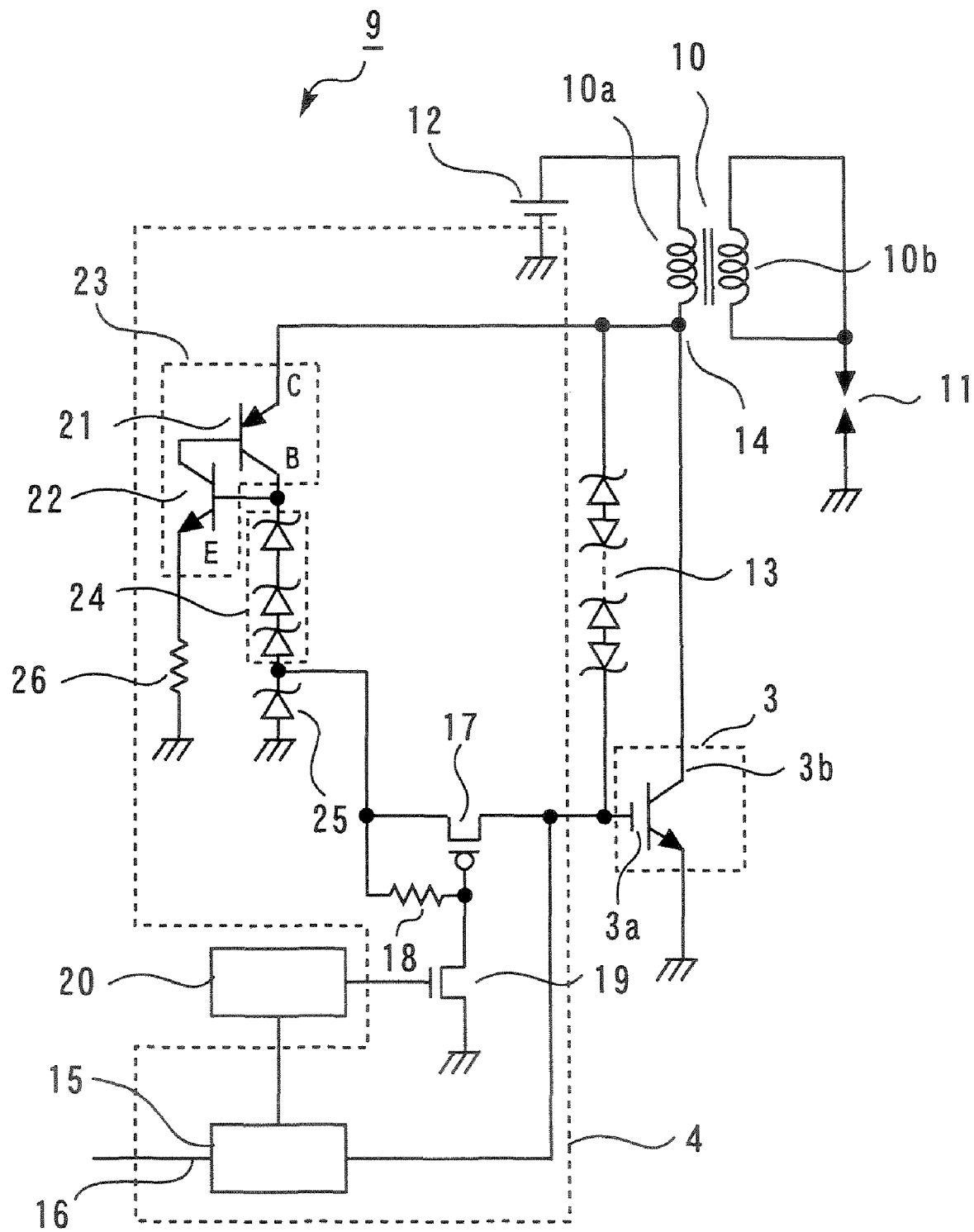
FIG. 3 is a circuit diagram of a semiconductor apparatus according to a second embodiment of the present invention.

The semiconductor apparatus according to the second embodiment is arranged by adding a thyristor and Zener diodes to the back-side high-withstand-voltage integrated circuit described above in the description of the first embodiment to reduce above-described ignition error. FIG. 3 shows a circuit diagram of this semiconductor apparatus.

As shown in FIG. 3, the semiconductor apparatus indicated by 9 has the back-side high-withstand-voltage integrated circuit 4 and the first switching device 3 connected to this circuit. A load coil 10 is connected to a point on the collector terminal side of the first switching device 3 (output terminal 3b side). The load coil 10 is connected to an ignition plug 11 of an engine and to a battery 12. The load coil 10 includes an input coil 10a and an output coil 10b. When a voltage equal to or higher than a predetermined first voltage ($V_1$) is applied to the input coil 10a, a current flows through the output coil 10b to operate the ignition plug 11. A bidirectional diode 13 is connected between the gate and the collector of the first switching device 3. When a voltage equal to or higher than a predetermined value is applied to the bidirectional diode 13, a current flows therethrough to protect the first switching device 3.

The first switching device 3 has an input terminal 3a and an output terminal 3b. The output terminal 3b is connected to the lower end (output terminal 14) of the input coil 10a in the load coil 10. When a predetermined voltage is applied to the input terminal 3a and when the first switching device 3 is thereby turned on, a high voltage is applied to the input coil 10a in the load coil 10. To the output terminal 14, the back side of the back-side high-withstand-voltage integrated circuit 4 is connected. The voltage on the backside (back-side voltage) of the back-side high-withstand-voltage integrated circuit 4 is output to the output terminal 14.

The back-side high-withstand-voltage integrated circuit 4 includes a control circuit 15. The control circuit 15 is connected to the input terminal 3a of the first switching device 3 and controls turning-on/off of the first switching device 3 in accordance with the on/off input signal input from the external terminal 16.

The back-side high-withstand-voltage integrated circuit 4 further has a PMOS transistor 17, a resistor 18 and an NMOS transistor 19. The PMOS transistor 17 is connected to the input terminal (gate) 3a of the first switching device 3. The gate of the NMOS transistor 19 and the control circuit 15 are connected to a timer circuit 20. The timer circuit 20 forcibly turns off the first switching device 3 when a predetermined time period passes after a start of the on-operation of the first switching device 3.

The back-side high-withstand-voltage integrated circuit 4 has a thyristor 23 constituted of a pnp transistor 21 and an npn transistor 22. The thyristor 23 has collector terminal (C), an emitter terminal (E) and a base terminal (B). The collector terminal (C) is connected to the input coil 10a in the load coil 10 via the output terminal 14. The emitter terminal (E) is grounded via a resistor 26. The base terminal (B) is connected to a Zener diode 24. When the thyristor 23 is turned on to cause a current to flow therethrough, a voltage on the input coil 10a in the load coil 10 is output to the base terminal (B).

The upper end of the above-described Zener diode 24 is connected to the base terminal (B) of the thyristor 23, while the lower end of the Zener diode is grounded via a Zener diode 25. The PMOS transistor 17 and the resistor 18 are connected to a connection point between the Zener diode 24 and the Zener diode 25.

In the semiconductor apparatus 9 shown in FIG. 3, when the first switching device 3 is on, the potential on the cathode (upper end) of the Zener diode 24 is substantially equal to the potential on the output terminal 14. When the voltage on the cathode of the Zener diode 24 is equal to or higher than a predetermined value (e.g., 500 V), a current flows from the output terminal 14 to the anode (lower end) of the Zener diode 24. The voltage on the cathode of the Zener diode 24 is lower than the predetermined value, a current flows from the output terminal 14 via the npn transistor 22 and the resistor 26. The voltage on the output terminal 14 can be maintained equal to or lower than the predetermined value in this way. That is, when the first switching device 3 is on, the thyristor 23 detects the voltage on the output terminal 14 and the Zener diode 24 controls the voltage on the output terminal 14 so that the voltage is equal to or lower than the predetermined value.

Thus, when the first switching device 3 is on and when the voltage output to the upper terminal of the Zener diode 24 is equal to or higher than a second voltage $V_2$ higher than the first voltage $V_1$ ($\neq$the voltage applied to the input coil 10$a$ when a current flows through the output coil 10$b$ in the load coil 10), a current flows from the upper terminal of the Zener diode 24 to the lower terminal of the Zener diode 24. The voltage on the output terminal 14 is thereby controlled so as to be equal to or lower than the second voltage $V_2$.

In the above-described arrangement, the semiconductor apparatus 9 detects the back-side voltage of the back-side high-withstand-voltage integrated circuit 4 by using the thyristor 23, and controls the back-side voltage by using the Zener diode 24 so that the back-side voltage is equal to or lower than the predetermined value, thereby reducing the occurrence of large electromotive force in the load coil 10. Erroneous ignition through the ignition plug 11 can be prevented in this way. Thus, engine protection and self-protection of the semiconductor apparatus can be achieved by reducing errors in ignition while limiting the area required for arrangement of the semiconductor apparatus.

The semiconductor apparatus according to the second embodiment is capable of reducing errors in ignition and performing engine protection and self-protection while limiting the area required for arrangement of the semiconductor apparatus.

Third Embodiment

A semiconductor apparatus according to a third embodiment of the present invention will be described. Description will be made mainly of points of difference from the second embodiment.

When the switching device in the semiconductor apparatus shown in the second embodiment is driven, a turning-on signal is transmitted from the computer to the switching device through the control circuit. There has been a need to connect to the semiconductor apparatus a power supply for driving the switching device at the time of transmission of the turning-on signal.

Figure 4:
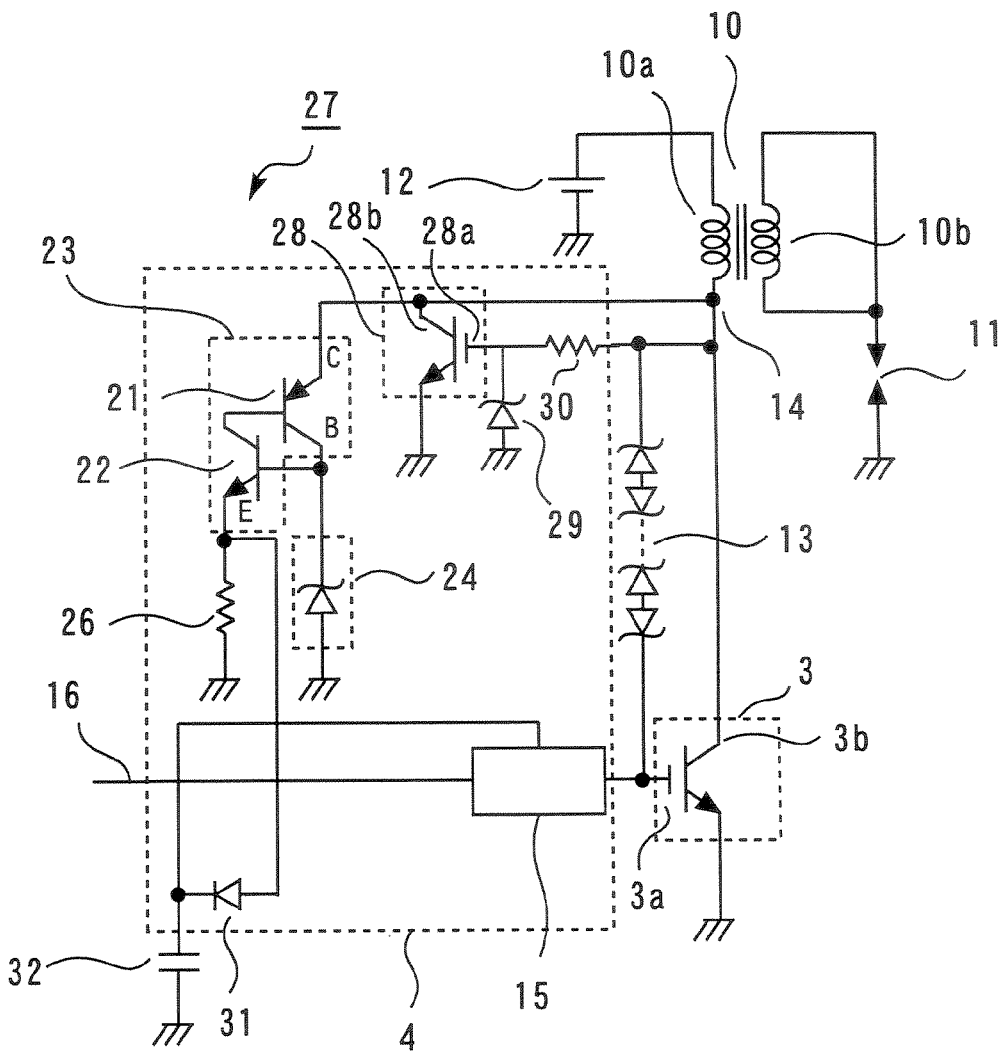
FIG. 4 is a circuit diagram of a semiconductor apparatus according to a third embodiment of the present invention.

In the semiconductor apparatus according to the third embodiment, a current necessary for driving the first switching device 3 described above in the description of the second embodiment is taken out when the switching device is off, and is stored in a capacitor, whereby the need for the above-described power supply is eliminated. FIG. 4 shows a circuit diagram of the semiconductor apparatus indicated by 27.

The output terminal 14 is connected to the load coil 10, as shown in FIG. 4. The upper end of the input coil 10$a$ in the load coil 10 is connected to the battery 12.

The back-side high-withstand-voltage integrated circuit 4 has the thyristor 23 and an IGBT 28 connected between the thyristor 23 and the output terminal 14. A Zener diode 29 and a resistor 30 are connected between the IGBT 28 and the output terminal 14.

The IGBT 28 functions as a second switching device for driving the thyristor 23. The IGBT 28 has an input terminal 28$a$ and an output terminal 28$b$. The input terminal 28$a$ is connected to the battery 12 via the input coil 10$a$ in the load coil 10. The output terminal 28$b$ is connected to the collector terminal (C) of the thyristor 23.

When the first switching device 3 is on, the potential on the output terminal 14 is high. Therefore, the voltage applied to the gate of the IGBT 28 can be reduced by increasing the resistance value of the resistor 30. Further, the Zener diode 29 is provided to set the voltage applied to the gate of the IGBT 28 equal to or lower than a predetermined value, thereby protecting the IGBT 28.

A diode 31 is connected to a connection point between the emitter terminal (E) of the npn transistor 22 and the resistor 26. The emitter terminal (E) of the thyristor 23 is connected to the upper end of a capacitor 32 via the diode 31. The control circuit 15 is also connected to the upper end of the capacitor 32. The lower end of the capacitor 32 is grounded.

In the apparatus arranged as described above, the voltage on the output terminal 14 is equal to the voltage of the battery 12 when the first switching device 3 is off. The IGBT 28 is set in the on state by the voltage supplied from the battery 12, thereby turning on the thyristor 23. A current is thereby caused to flow from the battery 12 via the output terminal 14, the thyristor 23 and the diode 31 to charge the capacitor 32.

As described above, the IGBT 28 is turned on by the voltage supplied from the battery 12 when the first switching device 3 is off. A current then flows from the battery 12 toward the capacitor 32 via the thyristor 23 to charge the capacitor 32.

The control circuit 15 can control turning-on/off of the first switching device 3 by using the charged capacitor 32 as a power supply. In other respects, the arrangement is the same as that of the second embodiment.

The above-described arrangement eliminates the need for the power supply for driving the first switching device 3, thus achieving a reduction in size of the semiconductor apparatus 27.

In the circuit arranged as shown in FIG. 4, there is a possibility of floating of the potential on the gate of the IGBT 3 when a surge is input from the battery 12 while the first switching device 3 is in the off state. A possibility of IGBT 3 thereby being driven to cause an operation error is also conceivable. However, the semiconductor apparatus 27 functions as a protective circuit only and, therefore, there is no risk of operation error due to a surge. Thus, the semiconductor apparatus can operate with improved safety.

The semiconductor apparatus according to the third embodiment has the same advantages as the semiconductor apparatus according to the first embodiment and further as the advantage of being reduced in size by eliminating the need for a power supply for driving the first switching device 3.

Fourth Embodiment

A semiconductor apparatus according to a fourth embodiment of the present invention will be described. Description will be made mainly of points of difference from the third embodiment.

Figure 5:
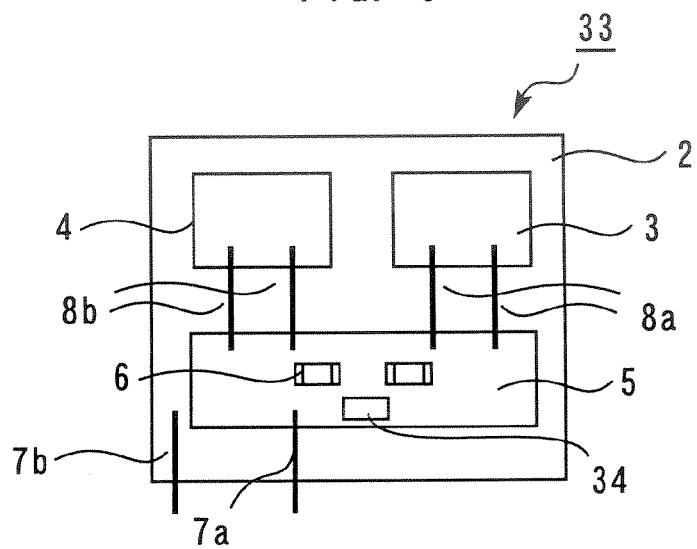
FIG. 5 is a plan view of a semiconductor apparatus according to a fourth embodiment of the present invention.
Figure 6:
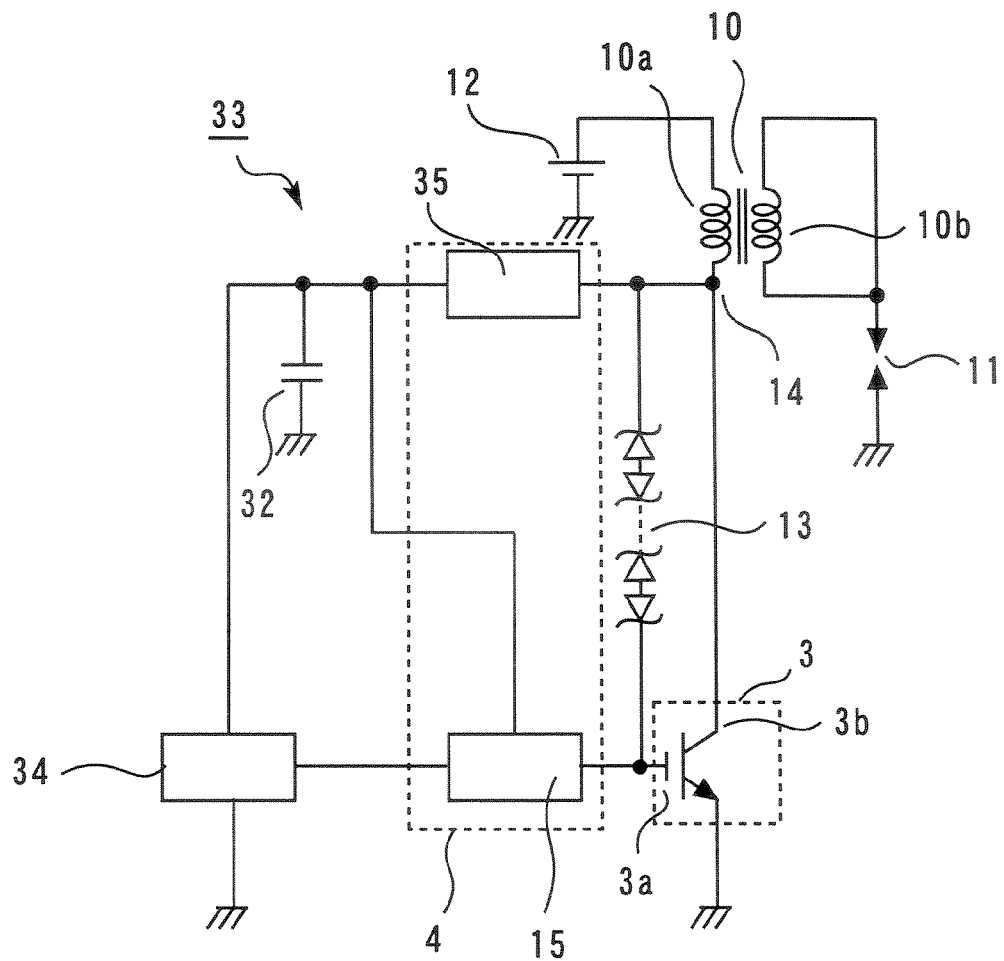
FIG. 6 is a circuit diagram of the semiconductor apparatus according to the fourth embodiment of the present invention.
Figure 7:
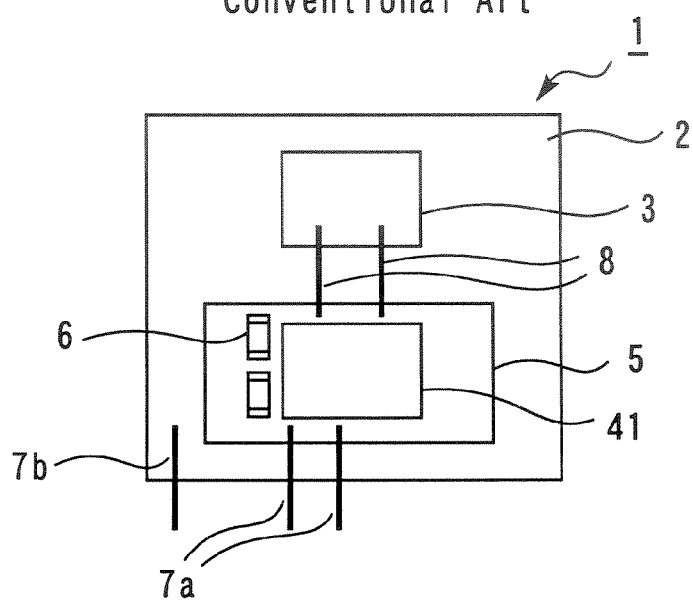
FIG. 7 is a plan view of a conventional semiconductor apparatus.

FIG. 5 shows a plan view of a semiconductor apparatus 33 according to the fourth embodiment. FIG. 6 shows a circuit diagram showing an arrangement including the semiconductor apparatus 33 shown in FIG. 5. A wireless module 34 for supplying an input signal to the control circuit 15 is connected to the capacitor 32 and to the control circuit 15. The capacitor 32 charged in the same manner as in the third embodiment is used as a power supply to enable the wireless module 34 to supply an input signal to the control circuit 15. In other respects, the arrangement is the same as that of the third embodiment.

In the above-described arrangement, a current necessary for driving the wireless module 34 can be taken out from the back-side voltage of the back-side high-withstand-voltage integrated circuit 4 to be supplied to the wireless module 34. There is, therefore, no need to provide a power supply for driving the wireless module 34. An input signal from the computer can be transmitted in a wireless manner due to the wireless module 34. Thus, wireless transmission is used in place of the input wiring to reduce in size of a semiconductor and further implement a semiconductor apparatus not easily affectable by noise and having higher reliability in comparison with the conventional apparatus.

The semiconductor apparatus according to the fourth embodiment has the same advantages as the semiconductor apparatus according to the third embodiment and further as the advantage of being reduced in size and improved in reliability.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-294207, filed on Oct. 30, 2006 including specification, claims, drawings and summary, on which the Convention priority of the present application is based, are incorporated herein by reference in its entirety.

What is claimed is:

1. A semiconductor apparatus comprising:
an electroconductive member;
a switching device electrically connected to the electroconductive member on the electroconductive member and having a withstand voltage between a front side and a back side as a first withstand voltage;
a back-side high-withstand-voltage integrated circuit provided on the electroconductive member separately from the switching device, incorporating a control circuit for controlling turning-on/off of the switching device, and having a withstand voltage between a front side and a back side as a second withstand voltage higher than the first withstand voltage;
an insulating substrate provided on the electroconductive member separately from the switching device and the back-side high-withstand-voltage integrated circuit;
input/output wiring connected to the insulating substrate;
first wiring connecting the insulating substrate and the switching device; and
second wiring connecting the insulating substrate and back-side high-withstand-voltage integrated circuit.

2. A semiconductor apparatus comprising:
a load coil including an input coil and an output coil, a current flowing through the output coil when a voltage equal to or higher than a first voltage is applied to the input coil;
a first switching device having an input terminal and an output terminal, the output terminal being connected to one end of the input coil in the load coil, the first switching device applying a voltage to the input coil in the load coil;
a control circuit connected to the input terminal of the first switching device, the control circuit controlling turning-on/off of the first switching device;
a thyristor having a collector connected to the input coil in the load coil, an emitter grounded, and a base to which a voltage on the input coil in the load coil is applied; and
a Zener diode having its one terminal connected to the base of the thyristor and having the other terminal grounded,
wherein when the first switching device is on and when a voltage output to the one terminal of the Zener diode is equal to or higher than a second voltage higher than the first voltage, a current flows from the one terminal of the Zener diode to the other terminal of the Zener diode.

3. The semiconductor apparatus according to claim 2, further comprising:
an external power supply connected to the other end of the input coil in the load coil;
a second switching device having an input terminal connected to the external power supply via the input coil in the load coil, and an output terminal connected to the collector of the thyristor; and
a capacitor having its one end connected to the control circuit and to the emitter of the thyristor, and having the other end grounded,
wherein when the first switching device is turned off, the second switching device is turned on by the voltage supplied from the external power supply and a current flows from the external power supply to the capacitor via the thyristor to charge the capacitor, and
wherein the control circuit controls turning-on/off of the first switching device by power from the charged capacitor.

4. The semiconductor apparatus according to claim 3, wherein a wireless module for supplying an input signal to the control circuit is connected to the capacitor, and the wireless module uses the capacitor as a power supply.

* * * * *